United States Patent [19]

Breslow

[11] 4,410,798
[45] Oct. 18, 1983

[54] INCREMENTAL OPTICAL ENCODER SYSTEM WITH ADDRESSABLE INDEX

[75] Inventor: Donald H. Breslow, Framingham, Mass.

[73] Assignee: Itek Corporation, Lexington, Mass.

[21] Appl. No.: 272,272

[22] Filed: Jun. 10, 1981

[51] Int. Cl.³ .............................................. H01J 3/14
[52] U.S. Cl. .......................... 250/231 SE; 340/347 P
[58] Field of Search ..................... 250/231 SE, 237 G; 356/395; 340/347 P

[56] References Cited

U.S. PATENT DOCUMENTS 4,224,515  9/1980  Terrell ........................... 250/231 SE
4,268,747  5/1981  Becchi et al. .................. 250/231 SE Primary Examiner—David C. Nelms
Assistant Examiner—J. Jon Brophy
Attorney, Agent, or Firm—Homer O. Blair; Robert L. Nathans; Gerald H. Glanzman

[57] ABSTRACT

The circuitry required to obtain a ing that of the quadrature pair, the bits of a multibit binary word are gated with a coarse index taken from the code disc. The multibit binary word includes square waves already available in the multiplier and an additional bit obtained from a logical combination of the pair of quadrature signals.

15 Claims, 10 Drawing Figures

INCREMENTAL OPTICAL ENCODER SYSTEM WITH ADDRESSABLE INDEX

DESCRIPTION

1. Technical Field

This invention relates to a system for monitoring the angular position of a device by counting pulses from a code track which is electro-optically detected. The system has means for providing a precise index signal from a less precise electro-optically detected signal.

2. Background

FIG. 1 illustrates a typical incremental encoder system. A code disc 20 is mounted to an encoder shaft 22, the angular position of which is to be monitored. The disc is generally glass and has an annular code track 24 inscribed thereon. The track comprises alternate transparent and opaque segments defining equal parts around the shaft 22. The number of code cycles may be up to several thousand. The angular position of the code disc 20 is monitored by electronically counting the cycles as they pass a detector, and the angle is even more precisely indicated by electronically dividing each cycle into up to 64 segments.

The track 24 is illuminated by a light emitting diode (LED) 26. The thus illuminated transparent and opaque segments of the track are viewed by photodetectors 28 through precision optical slits 30. The segments on the track 24 are so closely spaced that they form a diffraction grating which provides for high fidelity sinusoidal photodetector outputs as the code disc rotates. The sinusoidal outputs are processed in a multiplier circuit to provide high resolution square waves as the disc rotates. The square waves have an angular frequency many times the frequency of the track 24. To that end, Sidney Wingate has shown that two square waves of the same spatial frequency but 90° out of phase can be logically combined, as in an exclusive-OR gate, to provide a new square wave of twice the input frequency. If that signal having twice the frequency is then logically combined with a similar but out of phase signal, a signal having four times the spatial frequency of the original signals can be provided. The multiple phase shifting necessary in such a method is provided by summing and weighting sine and cosine signals. The resultant phase shifted sinusoids are then converted to square waves for the logical combination noted above. See U.S. Pat. Nos. 3,310,798 and 3,312,828 to Wingate.

In one high resolution example of an incremental encoder, two ×32 (times 32) quadrature square waves are derived (FIG. 2). The ×32 indication is based on the 32 states of the square wave with each code cycle of the code track 24. The frequency of a ×32 signal is 16 cycles per code track cycle. Each ×32 signal is generated in what is referred to as a ×32 multiplier. The ×32 square waves are phase shifted by $5\frac{5}{8}$ degrees with respect to each other to provide a total of 64 states within each code cycle. Deriving two ×32 square waves as shown provides 64 resolution states as well as direction of rotation information. Pulse trains are formed by differentiation to provide up-counting and down-counting ×64 clock sequences. These pulse trains are counted electronically to provide a precise designation of the angle of the disc 20 relative to a precise index signal derived from a less precise index code 27 on the disc 20.

The function of a conventional ×32 multiplier circuit is illustrated in FIGS. 2 and 3. One cycle of the code track 24 is shown at the top of FIG. 2, and the two sinusoidal outputs taken from that code track, plotted against code disc angle, are shown just below the track. The most significant square wave taken from the track, the ×2, is taken directly from the sine wave by squaring that wave. Additional square waves to be derived for increased resolution are the ×4, ×8, ×16 and ×32 sequences shown at the bottom of the figure.

To form the ×32 square wave, a family of waveforms is synthesized as shown in FIG. 2. This family of waveforms includes the sine wave and the sine wave phase shifted by increments of $11\frac{1}{4}$ degrees. Those waveforms are synthesized in parallel circuits in a manner illustrated in FIG. 3. Each waveform is formed by appropriately weighting the sine and cosine signals and summing those signals. The resultant vector is a sinusoid of the same amplitude and frequency as the original sinusoids but phase shifted from the sine by the amounts indicated. For a ×16 multiplier only half as many sinusoids would be required and they would be incremented by angles of $22\frac{1}{2}$ degrees. Similarly, a ×64 multiplier would require twice as many sinusoids incremented by $5\frac{5}{8}$ degrees.

The family of sinusoids is squared in parallel circuits to provide the square waves shown below the ×2 waveform. Then to provide a ×32 square wave ×4, ×8 and ×16 square waves must be derived in that order by combining waves in exclusive-OR gate logic circuitry. For example, the squared sine wave and the squared cosine wave are applied to an exclusive-OR gate to derive the ×4 wave. The ×4 wave is then used to derive the ×8 wave by applying it to an exclusive-OR gate along with a ×4 signal phase shifted by 45 degrees. That latter signal is in turn derived from the 45 degree and 135 degree signals applied to an exclusive-OR gate. Deriving the ×16 signal in this same manner requires twice as many parallel circuits to form phase shifted square waves and to combine those square waves with the next more significant wave. With each additional binary resolution weight derived from the track the number of weighting, summing and squaring circuits required is doubled.

The ×32 square wave advanced by $5\frac{5}{8}$ degrees shown at the bottom of FIG. 2 can be derived in a similar manner by generating an additional 14 sinusoids, not shown, and exclusive-OR gating the resultant square waves in another circuit. By then inverting each of the ×32 signals and differentiating them to provide a short pulse at each leading edge of the four ×32 signals, a ×64 clock signal, one with 64 clock pulses per code cycle, can be generated. Using suitable logic, two mutually exclusive ×64 pulse trains are provided as clockwise and counterclockwise clock outputs. The two sets of clock pulses can be counted in a bidirectional counter to provide an angular indication from an index.

The index is generated from a coarse index 27 which is $1\frac{1}{4}$ to $1\frac{1}{2}$ cycles wide. That coarse index is applied to a three input AND gate with one of the square waves A-P and an adjacent square wave from the phase advanced ×32 multiplier inverted. For example, the precise index shown at the bottom of FIG. 2 can be derived. This precise index serves as a reference and can be counted to provide the number of revolutions that the code disc makes. The precise index can be at any angle within the code cycle by electing the appropriate two square waves to be applied to the AND gate.

In my co-pending patent application, Ser. No. 197,646, filed Oct. 16, 1980, for An Optical Encoder System, I have disclosed a quadrant switched multiplier circuit which enables a substantial reduction in the number of sinusoidal wave forms which must be generated, squared and exclusive-OR gated to derive a pulse train of a given resolution. For example, in a ×32 multiplier only seven wave forms need be derived in summing and weighting circuits rather than the 14 wave forms needed in conventional ×32 multipliers. One problem encountered in the use of the quadrant switched multiplier in an incremental encoder is that, without a full set of square waves formed from the sinusoids, a precide index cannot be generated in the conventional manner for any desired angular position within a code cycle.

An object of this invention is to provide an addressable index generating circuit which allows for an index at any angle within a code cycle even where a quadrant switched multiplier is used.

SUMMARY OF THE INVENTION

An optical incremental angular encoder system includes a code disc having an optical code track and an optical coarse index formed thereon. The code track is detected and a multiplier circuit generates a high angular resolution signal which divides each code cycle into angular segments. A multi-bit binary output having a resolution matching that of the high resolution signal is taken from the multiplier circuit. This multi-bit output is logically combined with the coarse index signal to generate a precise index precisely located within the code cycle indicated by the coarse index.

Preferably, one bit of the multi-bit word is one of the pair of quadrature signals generally output from the multiplier circuit. More significant bits to that word are square waves used in the multiplier circuit to generate the quadrature pair and a less significant bit is formed from the quadrature pair.

BRIEF DESCRIPTION OF THE DRAWINGS

The foregoing and other objects, features and advantages of the invention will be apparent from the following more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

BEST MODE OF CARRYING OUT THE INVENTION

Figure 1:
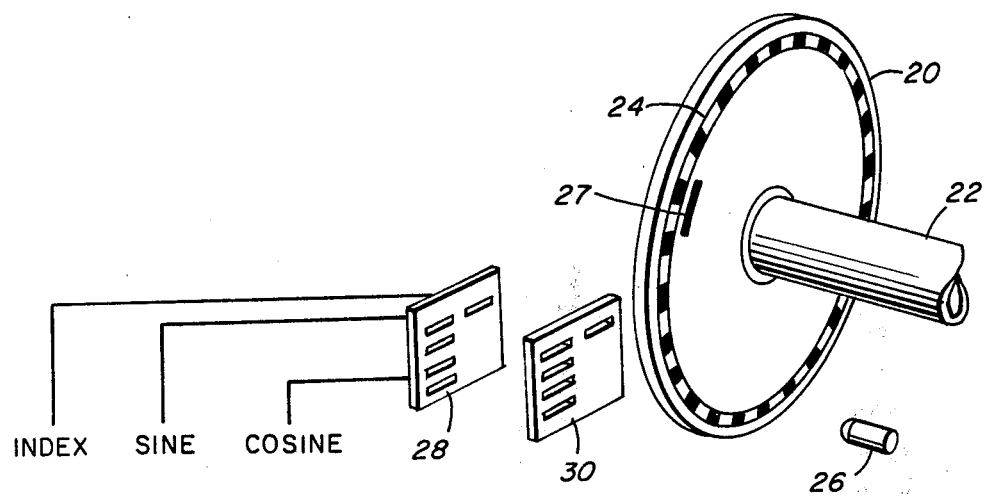
FIG. 1 is a perspective view illustrating a typical encoder disc and the code detecting optics for that disc.
Figure 3:
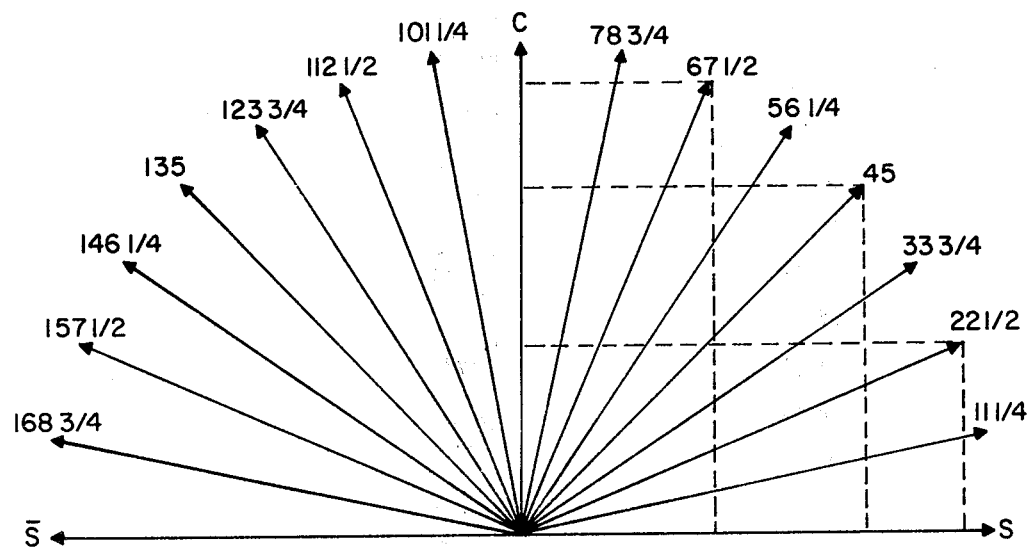
FIG. 3 illustrates the vector formation of phase shifted sinusoids in a conventional ×32 multiplier.
Figure 2:
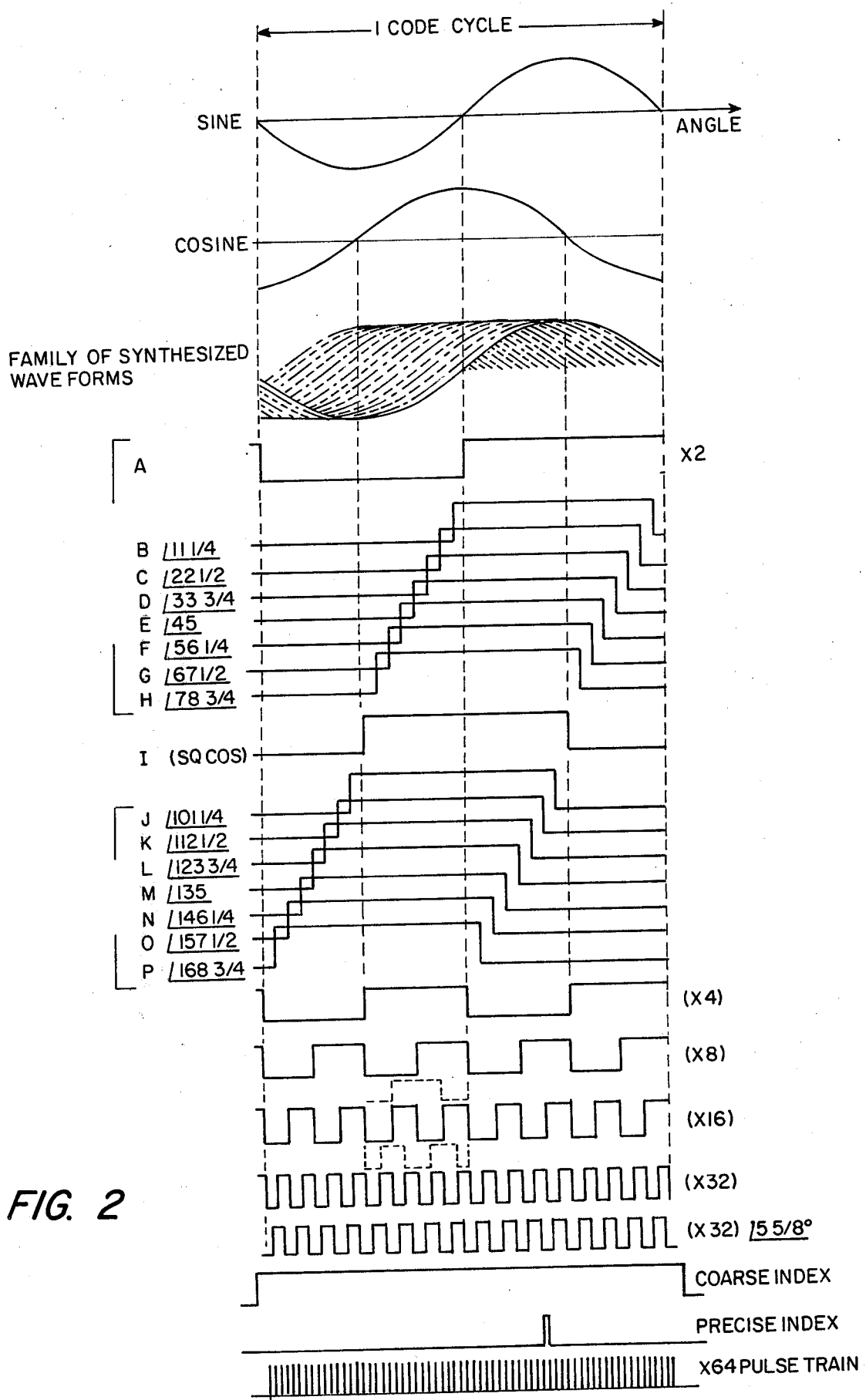
FIG. 2 shows sinusoids and pulse sequences formed in this and a conventional encoder system and a ×64 sequence generated in this system.

Before a description is made of the specific circuitry of the multiplier circuit, the logic of the quadrant switching multiplier taught in my copending application can be illustrated with reference to FIGS. 2 and 4. As can be seen in FIG. 2, the code sequences of the ×8 and less significant square waves repeat themselves through each quadrant of the code cycle. The four quadrants of that cycle are indicated by the vertical broken lines through the square waves.

Because each of the less significant sequences repeats itself through each quadrant, a multiplier circuit need only be designed for decoding the sinusoidal inputs to the multiplier in one such quadrant so long as the inputs to the multiplier are kept the same through each quadrant. To that end, it can be seen by a comparison of the squared phase shifted signals in FIG. 2 and the ×32 signal, for example, that the ×32 signal transitions occur at transitions of the individual squared signals. For example, in the first quadrant of the code cycle the transitions in the square waves advanced between 90 and 180 degrees control the transitions in the first quadrant of the code cycle. Similarly, the transitions of the square waves having phase angles between 0 degrees and 90 degrees control the transitions in the second quadrant of the code cycle. The falling edges of those two groups of square waves control the transitions in the third and fourth quadrants of the code cycle.

While sixteen waves are required to provide the needed transitions in the ×32 signal, it can be seen that the required number of square waves is reduced to almost half by operating the multiplier in a single quadrant; for example, the group of square waves at phase angles between 0 degrees and 90 degrees provides the number of transitions required in the second quadrant of the ×32 sequence. The problem does remain, however, as to the design of logic gates in the multiplier which provide the desired multiplier outputs within a quadrant from the phase shifted ×2 square wave signals in that quadrant. Further, if the same multiplier is to be used for each quadrant, the inputs to the multiplier must be varied according to the quadrant so that the square wave formation is that required by the logic gates.

Referring to the second quadrant of the code track cycle shown in FIG. 2, the ×8 waveform in the second quadrant is identical to the 45 degree square wave within that quadrant. Thus, to provide the ×8 sequence it is only necessary that a sinusoid, phase advanced 45 degrees from the sine input, be squared and passed directly to a ×8 output.

To derive the ×16 sequence in the second quadrant of the code cycle by means of exclusive-OR gating, the ×8 sequence and a signal having the waveform shown in broken lines below the ×8 sequence is required. That waveform can in turn be derived by exclusive-OR gating of the 22½ degree and 67½ degree signals in the second quadrant. Similarly, the ×32 sequence in the second quadrant can be derived by exclusive-OR gating the ×16 sequence and the waveform shown in broken lines below the ×16 sequence. That latter waveform can in turn be derived by exclusive-OR gating the 11¼, 33¾, 56¼ and 78¾ degree signals.

With the multiplier designed to perform the above-described gating functions when the code track is positioned for a second quadrant readout, the same multiplier can be used to provide the same output in each of the other three quadrants of the code track cycle by switching the sinusoidal inputs to the circuit. In those other quadrants the inputs must be switched to mimic the inputs normally found in the second quadrant. The signals to be switched into the weighting and summing circuits in each quadrant of the code cycle can be determined with reference to FIG. 4. In that Figure the conventional cosine and sine signals are shown along with those signals inverted. By selecting the inverted sine and the cosine signal to replace the cosine and sine signals the waveforms in the first quadrant duplicate the waveforms in the second quadrant for which the multiplier is designed. This is indicated by the bold lines for those signals. Similarly, in the third quadrant the sine and inverted cosine signals are chosen, and in the fourth quadrant the inverted cosine and inverted sine signals are chosen.

The quadrant of the code cycle within which the encoder is positioned is indicated by the ×2 and ×4 sequences. Those sequences are shown in Gray code in FIG. 4 (signals A and B).

The specific circuitry of the code detecting optics and the multiplier circuit and index generator are shown in FIGS. 5–10.

Figure 5:
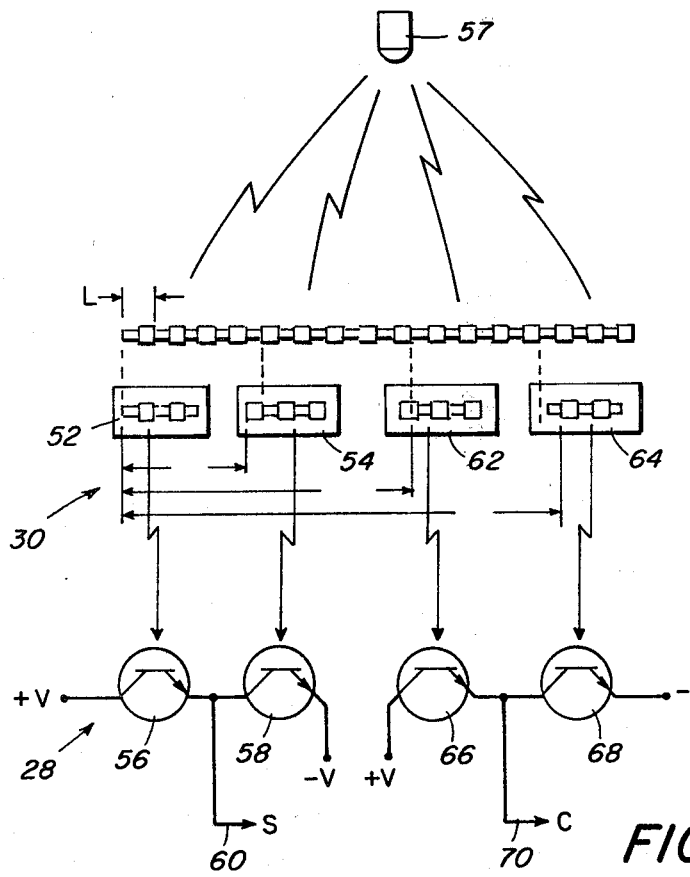
FIG. 5 is a schematic illustration of the code track detecting optics.
Figure 6:
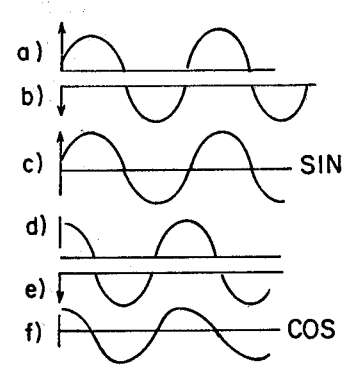
FIG. 6 shows plots of several waveforms in the circuit of FIG. 5 plotted against angular position of the code disc.

The photodetector circuit providing the sinusoidal output is shown in FIG. 5. Selected signals are shown plotted against angular position in FIG. 6. To provide a first sinusoidal output, designated the sine signal, two groups of slits 52 and 54 are precisely aligned with respect to the fine track 25 such that each is spaced a number of cycles plut 180 cycle degrees from the other. The detectors associated with the slits 52 and 54 are phototransistors 56 and 58 connected in a push/pull configuration. As shown, the slits 52 are aligned with transparent segments of the code track 25; thus the transistor 56 is illuminated by LED 57, and it conducts. On the other hand, the slits 54 are 180 degrees out of phase with respect to the slits 52 and are aligned with opaque segments so that the transistor 58 does not conduct. As the code disc rotates, the two transistors 56 and 58 are illuminated alternately to provide outputs as shown in FIGS. 6a and 6b. The resultant output on line 60 is a sinusoid as shown in FIG. 6c.

To provide a cosine signal, two groups of slits 62 and 64 are positioned a number of cycles plus 90 degrees from respective slit groups 52 and 54. As a result, cosine detector transistors 66 and 68 are illuminated to provide the combined output on line 70 illustrated in FIG. 6f. It can be seen that the cosine signal on line 6f is advanced 90 cycle degrees from the sine signal of FIG. 6c.

Figure 7:
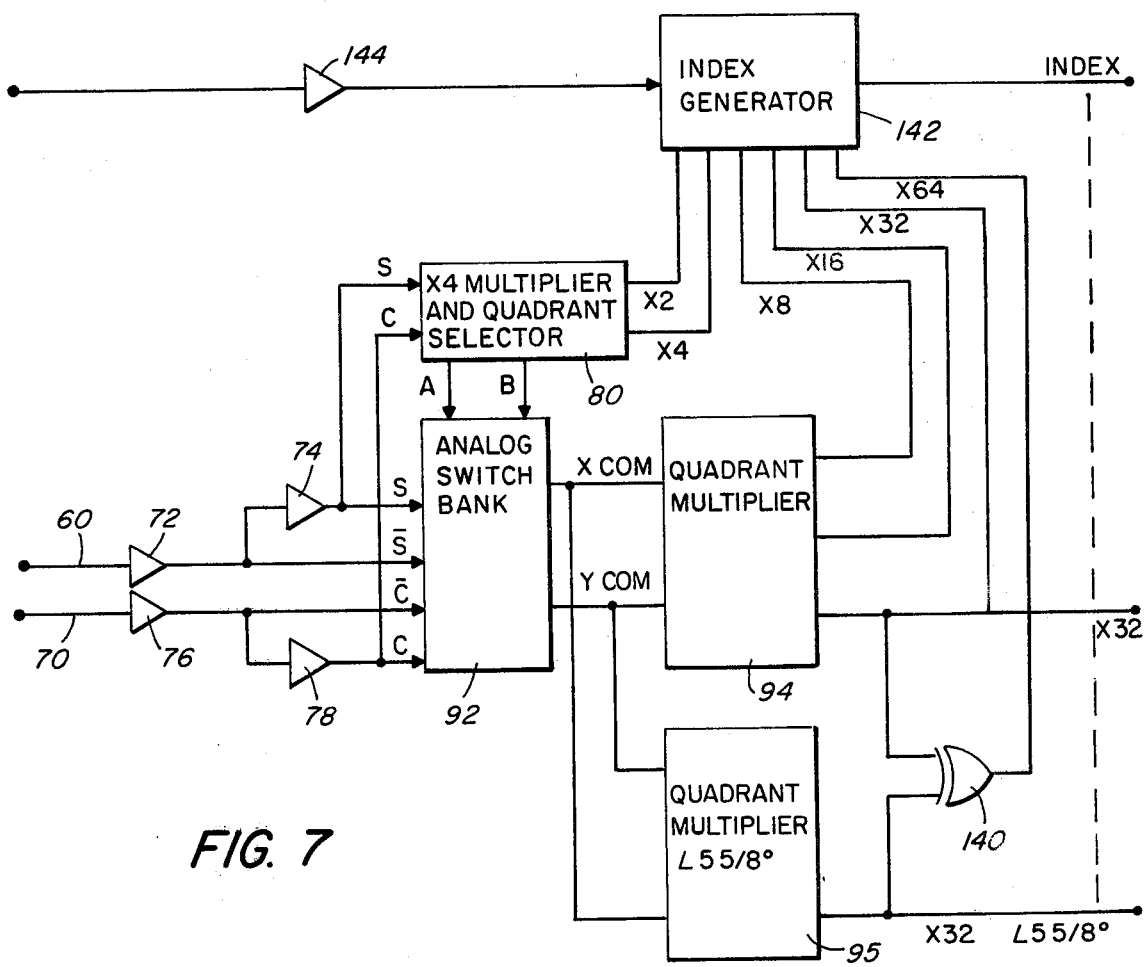
FIG. 7 is an electrical block diagram of an encoder system embodying this invention.
Figure 8:
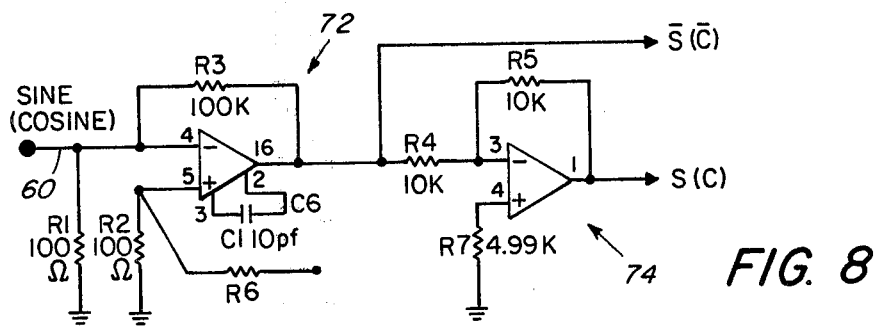
FIG. 8 is an electrical schematic of a preamplifier and inverter used in the multiplier circuit of FIG. 7.
Figure 9:
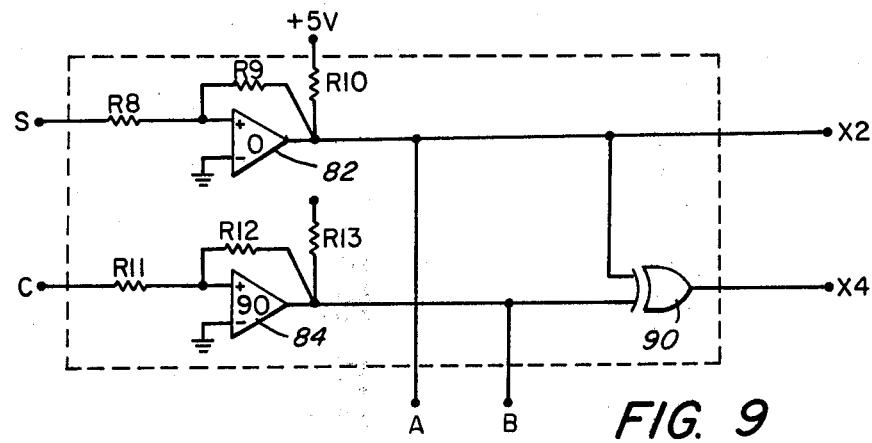
FIG. 9 is an electrical schematic of the ×4 multiplier and quadrant selector of FIG. 7.

As shown in FIG. 7 the sine wave on line 60 is amplified in an inverting preamplifier 72 to form the inverted sine wave $\bar{s}$. The signal $\bar{s}$ is then applied through an analoque inverter 74 to provide the amplified sine s. The preamplifier 72 and inverter 74 are shown in detail in FIG. 8. The cosine signal on line 36 is similarly preamplified and inverted in amplifier 76 and inverter 78.

To derive the ×2 and ×4 sequences, the sine and cosine signals are applied to the ×4 multiplier 80. The circuit 80 also provides the quadrant selecting bits A and B shown in FIG. 4. Specifically, in the circuit 80 the sine and cosine signals are applied to comparators 82 and 84 (FIG. 9) which provide the squared waveforms A and B. For the purpose of generating a precise index in a manner to be discussed below, that two bit Gray code is decoded to natural binary by means of the exclusive-OR gate 90 which provides the ×4 bit output.

As discussed above, the signals A and B indicate the quadrant of the code track cycle in which the code disc is positioned at any given instant. Those signals are applied to an analogue switch bank 92 which selects the particular s, c, $\bar{s}$ or $\bar{c}$ signals which should be applied to the weighting and summing circuits in a multiplier comprising two quadrant multipliers 94 and 95. Those sinusoids are passed to the quadrant multipliers on the X COM and Y COM lines. The multiplier 94 generates a ×32 output, and in doing so also generates ×8 and ×16 outputs. The multiplier 95 is similar to multiplier 94 except that it provides a ×32 output advanced by $5\frac{5}{8}$ degrees. The two ×32 outputs are a pair of quadrature square waves which can be used to derive the high resolution output pulse signal from the incremental encoder.

Figure 10:
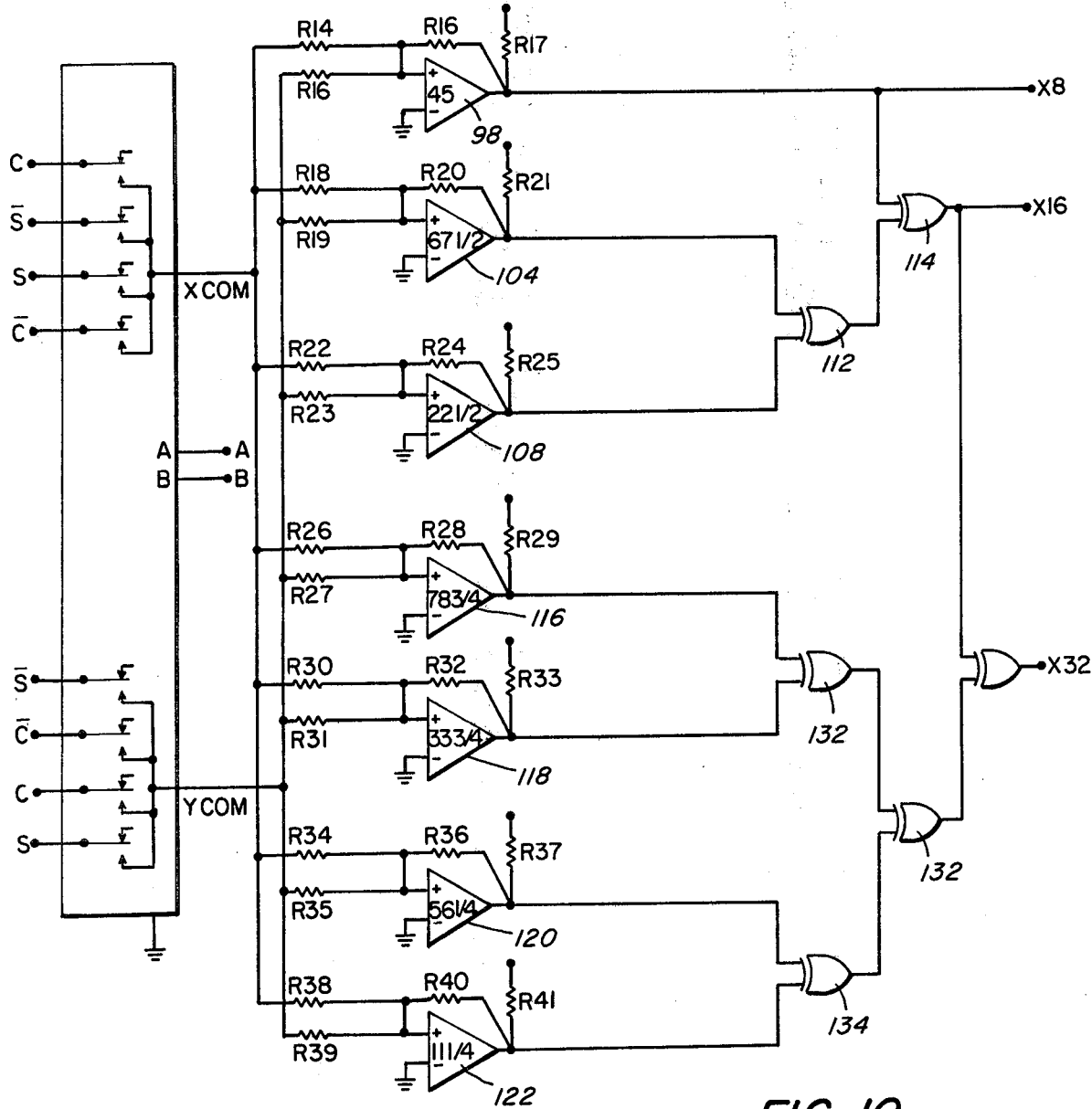
FIG. 10 is an electrical schematic of one of the multiplier circuits of FIG. 7, including quadrant switching of the multiplier inputs.

Each quadrant multiplier has the circuit configuration of FIG. 10 and is designed in accordance with the theory discussed above. That is, to provide the ×8 sequence the sinusoidal inputs are equally weighted by resistors R14 and R15 and are summed at node 96 at the noninverting input of a comparator 98. The output from the comparator 98 is a square wave advanced 45 degrees from the X COM wave.

As noted above, the ×16 signal is derived by exclusive-OR gating square waves phase shifted $22\frac{1}{2}$ degrees and $67\frac{1}{2}$ degrees from the X COM signal and exclusive-OR gating the resultant square wave with the ×8 signal. To that end, the signal advanced $22\frac{1}{2}$ degrees is formed by weighting and summing the resultant signals at node 102 at the input to comparator 104. Similarly, the $67\frac{1}{2}$ degree square wave is provided through comparator 108. The digital signals from the comparators 104 and 108 are gated through exclusive-OR gate 112 to provide the signal shown in broken lines below the ×8 sequence in FIG. 2. That signal is in turn exclusive-OR gated with the ×8 signal in gate 114 to provide the ×16 sequence.

In a similar fashion, the square waves phase shifted by $11\frac{1}{4}$ degrees, $33\frac{1}{4}$ degrees, $56\frac{1}{4}$ degrees and $78\frac{3}{4}$ degrees are derived by weighting and summing the sinusoids at the inputs to comparators 116, 118, 120 and 122. The $78\frac{3}{4}$ and $33\frac{1}{4}$ degree signals are applied to exclusive-OR gate 132 while the $56\frac{1}{4}$ and $11\frac{1}{4}$ degree signals are exclusive-OR gated in gate 134. The resultant signals are gated in exclusive-OR gate 136 to provide the signal shown in broken lines below the ×16 sequence in FIG. 2. Finally, that signal is exclusive-OR gated at 138 with the ×16 output to provide the ×32 output.

Figure 4:
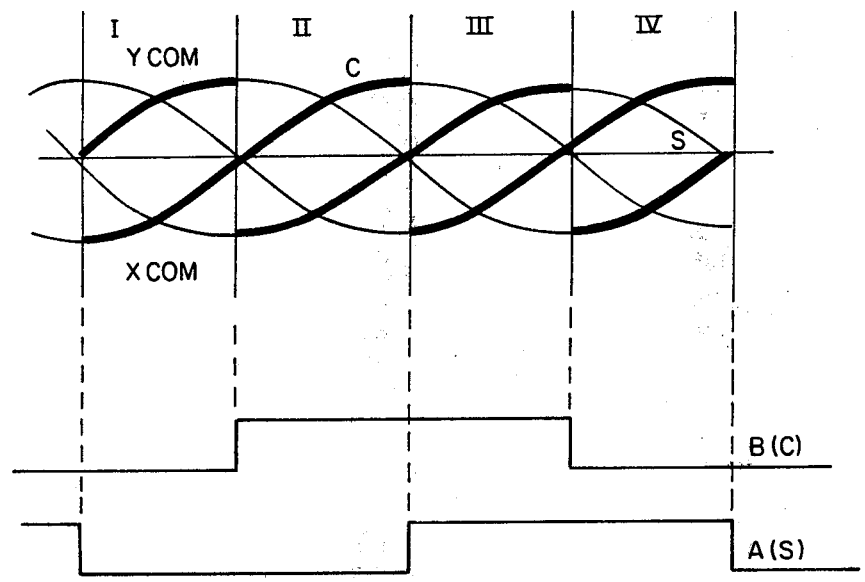
FIG. 4 illustrates the quadrant selecting and multiplier input waveforms for the multiplier circuit used in this invention.

Thus, it can be seen that, depending on the quadrant of the code track cycle indicated by the ×4 multiplier circuit, the sinusoids required to provide the inputs indicated by the bold lines in FIG. 4 are applied to the parallel weighting, summing and squaring circuits of the quadrant multiplier. Those signals are in turn applied to the logic gates which decode the phase shifted square waves to the ×8, ×16 and ×32 signals.

As in conventional multipliers, the phase shift of the sinusoid is determined by the relative resistances of the input resistors to the comparators, such as R14 and R15. The actual resistances are also dependent on the particular comparator used. The following table provides suitable resistance values for those input resistors in each of the quadrant multipliers 94 and 95:

|          | Multiplier 94 |                    | Multiplier 95 |                    |
|----------|---------------|--------------------|---------------|--------------------|
| Resistor | Phase Angle   | Resistance (ohms)  | Phase Angle   | Resistance (ohms)  |
| R14      | 45            | 8.87 K             | 50⅝           | 8.06 K             |
| R15      |               | 8.87 K             |               | 9.88 K             |
| R18      | 67½           | 6.19 K             | 73¼           | 5.69 K             |
| R19      |               | 15.0 K             |               | 18.7 K             |
| R22      | 22½           | 15.0 K             | 28⅛           | 12.7 K             |
| R23      |               | 6.19 K             |               | 6.81 K             |
| R26      | 78¾           | 5.36 K             | 84⅜           | 4.87 K             |
| R27      |               | 26.7 K             |               | 49.3 K             |
| R30      | 33¾           | 11.0 K             | 39⅜           | 9.88 K             |
| R31      |               | 7.32 K             |               | 8.06 K             |
| R34      | 56¼           | 7.32 K             | 61⅞           | 6.81 K             |
| R35      |               | 11.0 K             |               | 12.7 K             |
| R38      | 11¼           | 26.7 K             | 16⅞           | 18.7 K             |
| R39      |               | 5.36 K             |               | 5.69 K             |

The ×32 signal and the ×32 signal advanced by 5⅝ degrees of FIG. 2 are the usual quadrature outputs from an incremental encoder. These signals can be inverted, and by differentiating the rising edges of each of the four resultant pulse sequences, 64 pulses per cycle are obtained. Using suitable directional logic, the ×64 pulse sequence is provided at either a clockwise or counter-clockwise output. Those pulses drive bidirectional counter which monitor the precise position of the code disc relative to a precise index. The precise index is generated electronically from a coarse index detected on the code disc. The coarse index corresponds to between 1¼ and 1½ cycles of the code track. The precise index which is generated corresponds to a single segment of a ×64 division of that cycle. In conventional encoder systems, any segment within the cycle can be determined by two of the phase shifted square waves generated in the multipliers (including A-P in FIG. 2). With the use of quadrant multipliers, however, only half of those signals are available. Thus, to provide a precise index addressable to any segment within the cycle, another approach to generating that index must be used.

As shown in FIG. 7, the two ×32 sequences are applied to an exclusive-OR gate 140 to generate a ×64 output as shown in FIG. 2. Each of the ×2, ×4, ×8, ×16, ×32 and ×64 signals are then applied to an index generator 142. The index generator also receives a digitized coarse index signal through the comparator 144.

It can be seen that the ×2-×64 sequences together form a six bit word which can designate any one of the 64 segments of the code track cycle; that is, the resolution of this multibit word matches that of the quadrature ×32 pair. Those bits, or compliments of some of those bits, are applied to an AND gate in the generator 142 along with the digitized coarse index to provide the precise index. Thus, even though a full set of sinusoids is not available, an address may be formed anywhere in the cycle to key the index by using the six absolute bits from the code track either in direct or in logically complimented fashion. Any one of the 64 unique angle locations may be determined from the six bits available.

By providing inverters in the generator 142, twelve address signals are available to be input to the AND gate, and six are selected. With a conventional addressable index in a ×64 system thirty signals must be available to be connected into the index logic, although only two need be selected.

While the invention has been particularly shown and described with reference to a preferred embodiment thereof, it will be understood by those skilled in the art that various changes in form and details may be made therein without departing from the spirit and scope of the invention as defined by the appended claims.

I claim:

1. An incremental angular encoder system including an encoder having a code track and a coarse index formed thereon, means for detecting the code track and index, and a multiplier circuit for generating a high angular resolution signal which divides each code cycle into angular segments, the system characterized by:
   a multibit binary output from said multiplier circuit, the binary output word having an angular resolution matching that of said high resolution signal; and
   a logic circuit for generating a precise index signal within a code cycle indicated by the coarse index at an angular location determined by the multibit binary output.

2. An encoder system as claimed in claim 1 wherein the high resolution signal comprises a pair of quadrature square waves.

3. An encoder system as claimed in claim 2 wherein the two least significant bits of the multibit binary word are a square wave formed by a logical combination of the pair of quadrature square waves and one of the quadrature square waves.

4. An encoder system as claimed in claim 3 wherein the more significant bits of the multibit binary word are square waves from the multiplier which are there combined to form one of the pair of quadrature square waves.

5. An encoder system as claimed in claim 4 wherein the most significant bit of the word is a squared output from the code track.

6. An encoder system as claimed in claim 5 wherein the precise index is formed by AND gating the coarse index and the bits of the multibit binary word, in logically complimented fashion.

7. An optical incremental angular encoder system including a code disc having an optical code track and an optical coarse index formed thereon, means for detecting the code track and providing a sinusoidal output as a function of the angular position of the code disc, and a multiplier circuit for generating a high angular resolution signal which divides each code cycle in angular segments by deriving a family of phase shifted sinusoids in parallel circuits, converting the family of sinusoids to square waves and logically combining the square waves, the system characterized by:
   the multiplier circuit being designed to generate the high angular resolution signal only through one of a plurality of segments of code cycles;
   selection circuitry for selectively modifying the sinusoidal inputs to the multiplier circuit such that those inputs are identical through each of said segments of the code track cycle;
   a multibit binary output from said multiplier circuit, the binary output having an angular resolution matching that of said high resolution signal; and
   a logic circuit for generating a precise index signal within a code cycle indicated by the coarse index at an angular location determined by the multibit binary output.

8. An optical incremental angular encoder system including a code disc having an optical code track and an optical coarse index formed thereon, means for detecting the code track and providing a sinusoidal output as a function of the angular position of the code disc, and a multiplier circuit for generating a high angular resolution signal which divides each code cycle in angular segments by deriving a family of phase shifted sinusoids in parallel circuits, converting the family of sinusoids to square waves and logically combining the square waves, the system characterized by:

the multiplier circuit being designed to generate the high angular resolution signal only through a quadrant of the code cycle;

selection circuitry for selectively modifying the sinusoidal inputs to the multiplier circuit such that those inputs are identical through each quadrant of the code track cycle;

a multibit binary output from said multiplier circuit, the binary output word having an angular resolution matching that of said high resolution signal; and a logic circuit for generating a precise index signal within a code cycle indicated by a coarse index at an angular location determined by the multibit binary output.

9. An encoder system as claimed in claim 7 or 8 wherein the high resolution signal comprises a pair of quadrature square waves.

10. An encoder system as claimed in claim 9 wherein the two least significant bits of the multibit binary word are a square wave formed by a logical combination of the pair of quadrature square waves and one of the quadrature square waves.

11. An encoder system as claimed in claim 10 wherein the more significant bits of the multibit binary word are square waves from the multiplier which are there combined to form one of the pair of quadrature square waves.

12. An encoder system as claimed in claim 11 wherein the most significant bit of the word is a squared output from the code track.

13. An encoder system as claimed in claim 12 wherein the precise index is formed by AND gating the coarse index and the bits of the multibit binary word, in logically complimented fashion.

14. An optical incremental angular encoder system including a code disc having an optical code track and an optical coarse index formed thereon, means for detecting the code track and providing a sinusoidal output as a function of the angular position of the code disc, and a multiplier circuit for generating a high angular resolution signal which divides each code cycle in angular segments by deriving a family of phase shifted sinusoids in parallel circuits, converting the family of sinusoids to square waves and logically combining the square waves, the system characterized by:

the multiplier circuit being designed to generate the high angular resolution signal only through one of a plurality of segments of code cycles;

selection circuitry for selectively modifying the sinusoidal inputs to the multiplier circuit such that those inputs are identical through each of said segments of the code track cycle;

a multibit binary output from said multiplier circuit, the binary output having an angular resolution matching that of high resolution signal, the bits of the binary output including a squared output from the code track, square waves generated in the multiplier to form one of a quadrature pair of square waves, that one of the quadrature paid, and a square wave formed from the logical combination of the pair of quadrature square waves; and an AND logic circuit for generating a precise index signal within the code cycle indicated by the coarse index at an angular location determined by the multibit binary output.

15. A method of generating a precise index signal in an incremental angular encoder system having a multicycle code track and a coarse index on an encoder and means for generating a high resolution signal which divides the code cycle into high resolution angular segments, the method characterized by the steps of:

detecting the coarse index;

detecting the code track and providing a sinusoidal output which is a function of the angular position of the encoder;

from said sinusoidal output, generating a multibit, angle indicating, binary code word having an angular resolution matching that of said high resolution signal; and logically combining the multibit binary code word with the coarse index to provide a precise index matching the resolution of said high resolution signal.

* * * * *